(12) United States Patent
Hull et al.

(10) Patent No.: US 9,772,422 B2
(45) Date of Patent: Sep. 26, 2017

(54) SYSTEM AND METHOD FOR DETECTING OBJECTS

(71) Applicant: THE BOEING COMPANY, Chicago, IL (US)

(72) Inventors: John R. Hull, Sammamish, WA (US); Kathy L. Ferguson, Woodinville, WA (US); Christopher Allin Black, North Bend, WA (US); Daniel L. Byrum, Des Moines, WA (US)

(73) Assignee: The Boeing Company, Chicago, IL (US)

( * ) Notice: Subject to any disclaimer, the term of this patent is extended or adjusted under 35 U.S.C. 154(b) by 140 days.

(21) Appl. No.: 14/955,223

(22) Filed: Dec. 1, 2015

(65) Prior Publication Data

US 2016/0341843 A1 Nov. 24, 2016

Related U.S. Application Data

(60) Provisional application No. 62/162,873, filed on May 18, 2015.

(51) Int. Cl.
*G01R 33/12* (2006.01)
*G01V 3/08* (2006.01)
*G01R 33/028* (2006.01)
*G01V 3/15* (2006.01)

(52) U.S. Cl.
CPC ............. *G01V 3/08* (2013.01); *G01R 33/028* (2013.01); *G01V 3/15* (2013.01)

(58) Field of Classification Search
CPC .......... G01R 29/08; G01S 13/04; H01L 24/48
See application file for complete search history.

(56) References Cited

U.S. PATENT DOCUMENTS

| 2003/0154316 A1* | 8/2003 | Konz | H04L 12/40 709/253 |
| 2003/0163748 A1* | 8/2003 | Calkins | H04B 15/04 713/500 |
| 2011/0184679 A1* | 7/2011 | Kalokitis | G01R 19/145 702/65 |

* cited by examiner

*Primary Examiner* — Giovanni Astacio-Oquendo
*Assistant Examiner* — Alvaro Fortich
(74) *Attorney, Agent, or Firm* — Joseph M. Butscher; The Small Patent Law Group, LLC

(57) ABSTRACT

A system and method for locating an object within a structure includes a magnetically-responsive member coupled to the object. A magnetic field generator generates a magnetic field in the presence of the structure. The generated magnetic field causes the magnetically-responsive member to output a signal when the magnetically-responsive member is in the presence of the magnetic field. A detector may include a sensor coupled to a control unit. The sensor detects the signal output by the magnetically-responsive member. The control unit locates the object based on detection of a third harmonic of the signal.

20 Claims, 6 Drawing Sheets

SYSTEM AND METHOD FOR DETECTING OBJECTS

RELATED APPLICATIONS

This application relates to and claims priority benefits from U.S. Provisional Patent Application No. 62/162,873, entitled "System and Method for Detecting Foreign Objects," filed May 18, 2015, which is hereby incorporated by reference in its entirety.

FIELD OF THE DISCLOSURE

Embodiments of the present disclosure generally relate to systems and methods for detecting objects, and, more particularly, to systems and methods for detecting foreign objects within a structure, such as during the manufacture of a vehicle.

BACKGROUND OF THE DISCLOSURE

As a vehicle is being manufactured, foreign objects (that is, objects that are not to be part of the vehicle) may be present in an environment, and may infiltrate or otherwise settle on or in various components of the vehicle. As an example, one or more tools that are used to manufacture an aircraft may be inadvertently left on or in portions of the aircraft. Known systems and methods for searching for foreign objects known to be left on airplanes are typically time and labor intensive, as well as costly.

Typically, methods of preventing foreign objects within structure include reporting lost tools. For example, after a work period, an individual may account for all of the tools used. If any are missing, the individual begins searching for the missing tool(s). While such a method initiates a search for a foreign object (such as a missing tool), it does not provide an efficient way of finding the foreign object.

One possibility for detecting foreign objects includes placement of RFID devices on tools and other components. However, electrically-conductive sheets, such as aluminum aircraft skins and carbon composite layers, typically absorb RF signals, thereby shielding foreign objects from detection.

SUMMARY OF THE DISCLOSURE

A need exists for a system and method of efficiently detecting and locating objects, such as foreign objects, within or on a structure, such as a vehicle.

With that need in mind, certain embodiments of the present disclosure provide a system for locating an object within a structure. The system includes a magnetically-responsive member coupled to the object. A magnetic field generator is configured to generate a magnetic field (which may be a low applied magnetic field of 10 Oersteds, for example) in the presence of the structure. The magnetic field causes the magnetically-responsive member to output a signal when the magnetically-responsive member is in the presence of the magnetic field. A detector includes a sensor coupled to a control unit. The sensor is configured to detect the signal output by the magnetically-responsive member. The control unit is configured to locate the object based on detection of a third harmonic of the signal.

In at least one embodiment, a label is affixed to the object. The label identifies the object. The magnetically-responsive member may be secured to the label. In at least one other embodiment, the magnetically-responsive member is directly secured to the object.

The magnetic field generator may be remote from the detector. In at least one other embodiment, the magnetic field generator and the detector may be contained in a common housing.

The magnetically-responsive member may be formed of a mu-metal. In at least one embodiment, the magnetically-responsive member may include a ferromagnetic coil. The magnetically-responsive member may be formed of a ferromagnetic material that is not found in the structure.

The control unit may be configured to compare the third harmonic to a threshold value associated with the magnetically-responsive member to determine the presence of the magnetically-responsive member. The control unit may be configured to disregard other signals that do not meet the threshold value. The control unit may be configured to determine a distance of the magnetically-responsive member to one or both of the detector or the magnetic field generator based on a strength of the third harmonic.

Certain embodiments of the present disclosure provide a method of locating an object within a structure. The method may include coupling a magnetically-responsive member to the object, generating a magnetic field in the presence of the structure, causing the magnetically-responsive member to output a signal when the magnetically-responsive member is in the presence of the magnetic field, detecting the signal output by the magnetically-responsive member, and locating the object based on a third harmonic of the signal that is detected.

The coupling may include securing the magnetically-responsive member to a label that identifies the object, and affixing the label to the object. In at least one other embodiment, the coupling may include directly securing the magnetically-responsive member to the object.

The locating may include comparing the third harmonic to a threshold value associated with the magnetically-responsive member to determine the presence of the magnetically-responsive member, and disregarding other signals that are below the threshold value. The locating may include determining a distance of the magnetically-responsive member to one or both of the detector or the magnetic field generator based on a strength of the third harmonic.

DETAILED DESCRIPTION OF THE DISCLOSURE

Figure 1:
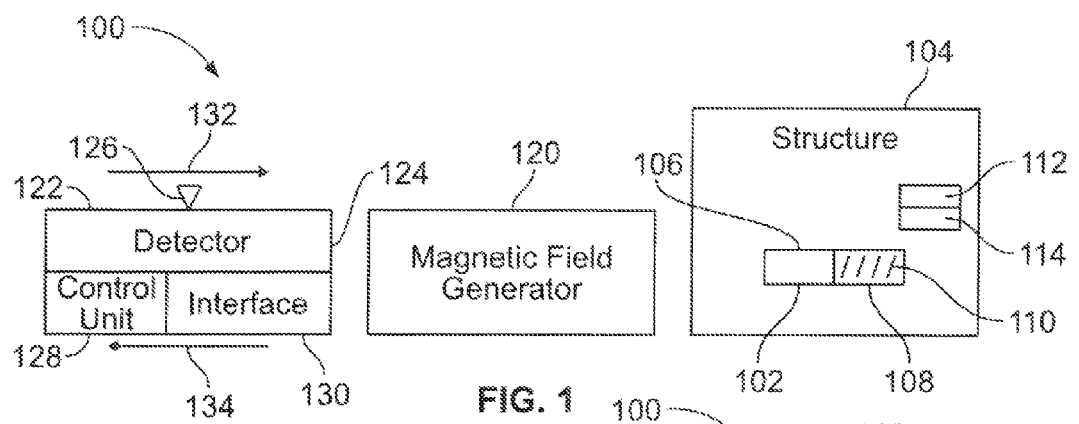
FIG. 1 illustrates a schematic diagram of a system for detecting a foreign object proximate to a structure, according to an embodiment of the present disclosure.

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular condition may include additional elements not having that condition.

Certain embodiments of the present disclosure provide systems and methods for detecting objects, such as foreign objects, within and/or proximate to a structure, such as an aircraft. The foreign objects may include tools, fasteners, work accessories (for example, protective eyewear), garments, and/or the like that are left on or in one or more portions of a vehicle (such as an airplane) during a manufacturing process.

A foreign object is an object that is not designed to be part of a structure. The foreign object may be an object that may be used to assemble a structure, but is not to be part of the structure. For example, the foreign object may be a tool that is used by an individual to assemble components of a vehicle (such as an aircraft).

Certain embodiments of the present disclosure provide a system and a method that include a magnetic material that magnetizes at low applied magnetic fields. For example, the low applied magnetic field may have a value of 10 Oersteds (Oe). Alternatively, the low applied magnetic field be greater or less than 10 Oe, such as 5 Oe, or 15 Oe.

In at least one embodiment, the magnetic material may not be used in actual components of the structure being assembled. In the presence of an excitation field, the sensitive magnetic material generates a magnetic signal that contains a third harmonic of the excitation frequency, while other magnetic materials in the background generate weak magnetic signals at the fundamental excitation frequency.

The system and method may use a low-frequency excitation signal that is capable of penetrating electrically conducting sheets in a vehicle, such as an airplane. As such, the electrically conducting sheets may not shield the foreign object from being detected.

The system and method may include embedding a magnetic material in the form of small wires into labels that are routinely affixed to tools used in the airplane manufacturing process. As such, there is minimal or no disruption of the present manufacturing system and method.

Certain embodiments of the present disclosure provide a method of locating an object. The method may include attaching a label to the object. The label may include a magnetically-responsive member, such as a mu-metal (µ metal)component, which may be in the form of a wire, tag, sheet, and/or the like. The method may also include transmitting a low-frequency signal over a predetermined distance. The signal is configured to excite the magnetically-responsive member when it is within the predetermined distance. The method may also include comparing a third harmonic component of any signals received at the detector based on the transmitted signal, and distinguishing the magnetically-responsive member from various other metallic components based on the comparison.

The label may include a bar code. The method may also include identifying the object based on the bar code.

In at least one embodiment, the magnetically-responsive member may include the mu-metal component, which may include a flat coil. The method may also include attaching the flat coil to the label. The coil may include a plurality of individual wires. In at least one embodiment, the coil may include a nickel-iron alloy.

The method may also include transmitting the signal from an exterior of an aircraft to locate the object within an interior of the aircraft.

FIG. 1 illustrates a schematic diagram of a system 100 for detecting a foreign object 102 proximate to (such as within an immediate vicinity) a structure 104, according to an embodiment of the present disclosure. The foreign object 102 may be a tool, work accessory (such as protective eye wear, a helmet, or the like), garment (such as a protective coat), identification badge, and/or the like. The structure 104 may be a portion of a vehicle. For example, the structure 104 may be a portion of a wing or fuselage of an aircraft that is being assembled.

The foreign object 102 includes a body 106 and a label 108 secured to the body 106. For example, the body 106 may include a handle and an operative head of a tool. The label 108 may be secured to the body 106 through an adhesive, fastener(s), etching, deposition, and/or the like. The label 108 may include an identification (such as a part number, name, bar code, and/or the like) that identifies the specific foreign object 102.

A magnetically-responsive member 110 is secured to the label 108. The magnetically-responsive member 110 may be formed of a ferromagnetic material that responds to the presence of a magnetic field. For example, in the presence of a magnetic field, the magnetically-responsive member 110 may output a magnetic signal, such as a magnetic component having a fundamental frequency, a first harmonic of the fundamental frequency, a second harmonic of the fundamental frequency, and a third harmonic of the fundamental frequency. That is, the magnetic field excites the magnetically-responsive member 110, thereby causing the magnetically-responsive member 110 to emit the magnetic signal, which includes signal components, including the third harmonic of the signal.

The magnetically-responsive member 110 may be a wire, strap, sheet, film, or the like that is secured to the label 108. The magnetically-responsive member 110 may be secured to an outer surface of the label 108. In at least one other embodiment, the magnetically-responsive member 110 may be embedded within the label 108. Alternatively, the magnetically-responsive member 110 may be directly secured on or within the foreign object 102, instead of being secured to the label 108.

In at least one embodiment, the magnetically-responsive member 110 is formed of a mu-metal. A mu-metal is a soft magnetic nickel-iron alloy having high permeability.

One example of a mu-metal is formed of approximately 77% nickel, 16% iron, 5% copper and 2% chromium or molybdenum. Another example, of a mu-metal is formed of approximately 80% nickel, 12-15% iron, 5% molybdenum, and a remaining portion formed of silicon, for example, by itself and/or on combination with other materials. Mu-metals typically exhibit relative permeability values of 80,000-100,000, in contrast to steel, which may have permeability values that are fractions thereof. A mu-metal exhibits low magnetic anisotropy and magnetostriction, thereby providing it a low coercivity so that it saturates at low magnetic fields. Mu-metals are ductile, malleable, and overall easily workable, thereby allowing them to be easily formed into thin sheets, coils, wires, and/or the like, which may be secured on or within the label 108.

The structure 104 is formed of various components 112 and 114, such as internal frames, joints, fasteners, ductwork, electronics, and/or the like. The components 112 and 114 may not be formed of the same material as the magnetically-responsive member 110. That is, the magnetically-responsive member 110 may be formed of a material that is separate, distinct, and unique in comparison to any of the materials within the structure 104.

The system 100 may include a magnetic field generator 120 and a detector 122. The magnetic field generator 120 is configured to generate a magnetic field within the vicinity of the structure 104. That is, the structure 104 is within the magnetic field generated by the magnetic field generator 120. As such, the magnetic field generator 120 may be positioned in close proximity to the structure 104. In at least one embodiment, the magnetic field generator 120 may be positioned within the structure 104. In at least one other embodiment, the magnetic field generator 120 may be positioned outside of the structure 104, such as within 10 feet of the structure. In at least one other embodiment, the magnetic field generator 120 may be positioned within a housing that contains the detector 122.

The detector 122 includes a housing 124 that may include a sensor 126 coupled to a control unit 128, which may in turn be coupled to an interface 130. The sensor 126 may be one or more of a coil, antenna, and/or the like that is configured to detect a magnetic field, signal, and/or components thereof. The control unit 128 is in communication with the sensor 126 and is configured to detect a strength of the magnetic field, and/or the signal output by the magnetically-responsive member 110 in the presence of the magnetic field, as sensed by the sensor 126. Based on the signal detected by the sensor 126, the control unit 126 may determine a fundamental frequency of the signal output by the magnetically-responsive member 110, a first harmonic of the signal, a second harmonic of the signal, and a third harmonic of the signal.

The interface 130 may be or include a display and/or an audio unit. The interface 130 is in communication with the control unit 128. The interface 130 is configured to display and/or emit audio signals that provide information as to the presence and strength of the third harmonic of the signal output by the magnetically-responsive member 108.

In operation, the system 100 is used to detect the presence of the foreign object 102 based on detection of the third harmonic of the signal output by the magnetically-responsive member 110. The magnetically-responsive member 110 is formed of a ferromagnetic material that generates a signal having a third harmonic that is recognizable in the presence of a generated magnetic field, such as a low applied magnetic field (such as a magnetic field of, for example, of 5-15 Oe). In contrast, to the extent that the components 112 and 114 output signals having a third harmonic in the presence of the generated magnetic field, the strength of the third harmonic is substantially less than that output by the magnetically-responsive member 110. For example, the components 112 and 114 may output signals in the presence of the generated magnetic field that do not include a third harmonic. In at least one other embodiment, the components 112 and 114 may output a signal in the presence of a magnetic field having a third harmonic that is orders of magnitude less (for example, 10 or 20 times less) than the third harmonic output by the magnetically-responsive member 110. As such, the control unit 128 may differentiate between such third harmonics. For example, the control unit 128 may disregard a third harmonic that is below a threshold. The threshold may be a fractional value of a third harmonic output by the magnetically-responsive member 110. For example, the threshold may be $1/10$ of the third harmonic that is generated by the magnetically-responsive member 110 in the presence of a generated magnetic field. Optionally, the threshold may be greater (for example, $1/5$) or less (for example, $1/100$) of $1/10$ of the third harmonic that is generated by the magnetically-responsive member 110.

In the presence of an applied low magnetic field (such as a magnetic field of 10 Oe), each of the components 112 and 114 may emit a signal having a fundamental frequency. Further, the first and second harmonics of the signals emitted by the components 112 and 114 may be strong enough to be detected. However, the third harmonics of the signals emitted by the components 112 and 114 (due to the nature of the materials that form the components 112 and 114) are typically too weak to be detected by the detector 122. In contrast, the third harmonic of the signal emitted by the magnetically-responsive member 110 has sufficient strength to be recognizable and detectable by the detector 122. Accordingly, the third harmonic is used to readily identify the magnetically-responsive member 110 (and therefore the foreign object 102) in the presence of numerous other components of the structure 104, such as the components 112 and 114.

In the presence of the magnetic field generated by the magnetic field generator 120, the magnetically-responsive member 110 secured to the label 108 of the foreign object 102 outputs a signal (for example, a magnetic signal). That is, the generated magnetic field excites the magnetically-responsive member 110, thereby causing the magnetically-responsive member 110 to emit the signal. The detector 122 detects the signal output by the magnetically-responsive member 110. The signal has a discernable third harmonic, due to the nature of the material used to form the magnetically-responsive member 110.

The control unit 128 recognizes the presence of the third harmonic of the signal output by the magnetically-responsive member 110. As the detector 122 and/or the magnetic field generator 120 moves closer to the foreign object 102 in the direction of arrow 132, the strength of the third harmonic increases. As such, the control unit 128 determines that the foreign object 102 is getting closer, and may indicate as much through the interface 130, whether through visual cues on a display screen, and/or audio signals through an audit unit (such as a speaker). Conversely, as the detector 122 and/or the magnetic field generator 120 move away from the foreign object 102 in the direction of arrow 134, the strength of the third harmonic decreases. As such, the control unit 128 determines that the foreign object 102 is further away, and may indicate as much through the interface 130. In short, the control unit 128 may determine a distance of the magnetically-responsive member 110 on the foreign object 102 to one or both of the detector 122 and/or the magnetic field generator 120 based on a strength of the detected third harmonic.

Because the components 112 and 114 may not exhibit detectable, recognizable, or otherwise appreciable third harmonics (based on a predetermined threshold associated with the magnetically-responsive member 110, for example) in relation to the third harmonic generated by the signal output by the magnetically-responsive member 110 in the presence of the generated magnetic field, the detector 122 is able to detect the presence of (and locate) the foreign object 102, without interference or false positives from the actual components 112 and 114 of the structure 104. As such, the system 100 is able to effectively differentiate between the foreign object 102 and the components 112 and 114, and efficiently locate the foreign object 102.

As described above, the control unit 128 may be used to control operation of the detector 122. As used herein, the term "control unit," "unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control unit 128 may be or include one or more processors that are configured to control operation of the detector 122.

The control unit 128 is configured to execute a set of instructions that are stored in one or more storage elements (such as one or more memories), in order to process data. For example, the control unit 128 may include or be coupled to one or more memories. The storage elements may also store data or other information as desired or needed. The storage elements may be in the form of an information source or a physical memory element within a processing machine.

The set of instructions may include various commands that instruct the control unit 128 as a processing machine to perform specific operations such as the methods and processes of the various embodiments of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein may illustrate one or more control or processing units, such as the control unit 128. It is to be understood that the processing or control units may represent electronic circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the control unit 128 may represent processing circuitry such as one or more of a field programmable gate array (FPGA), application specific integrated circuit (ASIC), microprocessor(s), and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

Figures 2, 3:
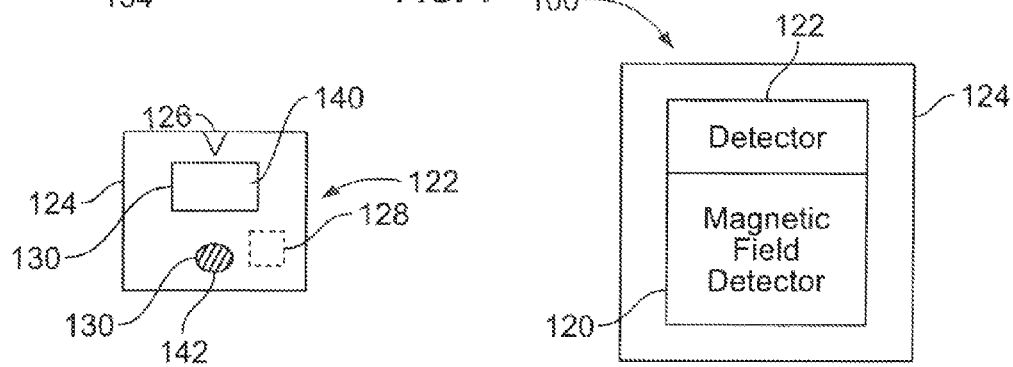
FIG. 2 illustrates a simplified front view of a detector, according to an embodiment of the present disclosure.
FIG. 3 illustrates a simplified block diagram of a system for detecting a foreign object, according to an embodiment of the present disclosure.

FIG. 2 illustrates a simplified front view of the detector 122, according to an embodiment of the present disclosure. The detector 122 may include the housing 124, which may be configured to fit within a hand of an individual. For example, the detector 122 may be a handheld device, which may be the size of a cellular telephone. The sensor 126 is secured to the housing 124 and is in communication with the control unit 128, such as through one or more wired or wireless connections. The control unit 128 may be contained within the housing 124.

The interface 130 may include one or both of a display 140 and/or a speaker 142. The display 140 may include a screen, such as a digital display screen, one or more lights (such as light emitting diodes—LEDs), and/or the like that are configured to show data and/or directions output by the control unit 128. For example, the display 140 may include a series of LEDs that emit light in response to a strength of a detected third harmonic of a signal output by the magnetically-responsive member 110 (shown in FIG. 1) in the presence of magnetic field. The speaker 142 is configured to emit audio signals as directed by the control unit 128. For example, the control unit 128 may cause the speaker 142 to generate a first audio signal when the foreign object 102 (shown in FIG. 1) is getting closer, and a second audio signal when the foreign object 102 is relatively moving further away. The first audio signal may be, for example, an audio signal stating "closer," while the second audio signal may be, for example, an audio signal stating "further." Optionally, the audio signals may be clicks or beeps, which may increase in rate when the foreign object is closer, and decrease in rate when the foreign object is further away.

FIG. 3 illustrates a simplified block diagram of the system 100 for detecting the foreign object 102 (shown in FIG. 1), according to an embodiment of the present disclosure. In this embodiment, the magnetic field generator 120 and the detector 122 may be contained in a common housing 124, which may be held by an individual.

Figure 4:
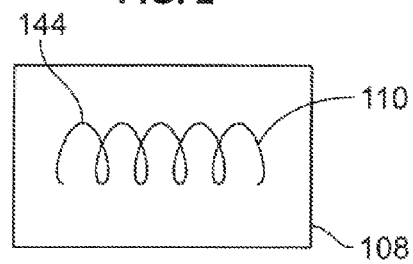
FIG. 4 illustrates a front view of a label, according to an embodiment of the present disclosure.

FIG. 4 illustrates a front view of the label 108, according to an embodiment of the present disclosure. The label 108 may be a thin film that adheres to an outer surface of the foreign object 102 (shown in FIG. 1). The magnetically-responsive member 110 may be secured to an outer surface of the label 108. As shown, the magnetically-responsive member 110 may be a ferromagnetic coil 144, such as formed of a mu-metal. Optionally, the magnetically-responsive member 110 may be embedded within the label 108.

Alternatively, the magnetically-responsive member 110 may be directly secured to the foreign object 102 without the use of the label 108.

Figure 5:
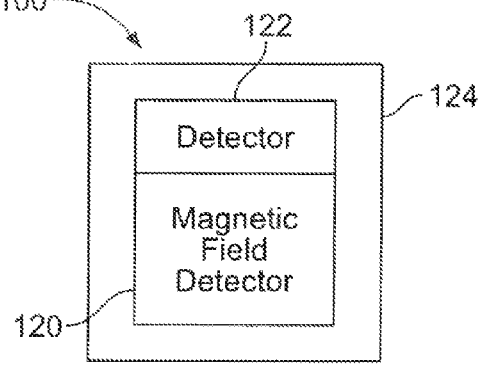
FIG. 5 illustrates a front view of a label, according to an embodiment of the present disclosure.

FIG. 5 illustrates a front view of the label 108, according to an embodiment of the present disclosure. As shown, the magnetically-responsive member 110 may be ferromagnetic strip 146, such as formed of a mu-metal. Optionally, the magnetically-responsive member 110 may be embedded within the label 108. Alternatively, the magnetically-responsive member 110 may be directly secured to the foreign object 102 (shown in FIG. 1) without the use of the label 108.

Figure 6:
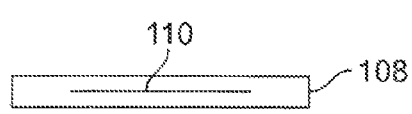
FIG. 6 illustrates a lateral view of a label, according to an embodiment of the present disclosure.

FIG. 6 illustrates a lateral view of the label 108, according to an embodiment of the present disclosure. As shown, the magnetically-responsive member 110 may be embedded within the label 108.

Figure 7:
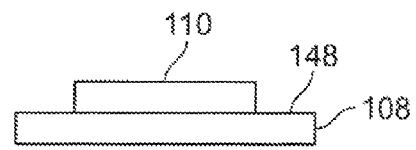
FIG. 7 illustrates a lateral view of a label, according to an embodiment of the present disclosure.

FIG. 7 illustrates a lateral view of the label 108, according to an embodiment of the present disclosure. As shown, the magnetically-responsive member 110 may be secured to an outer surface 148 of the label 108.

Figure 8:
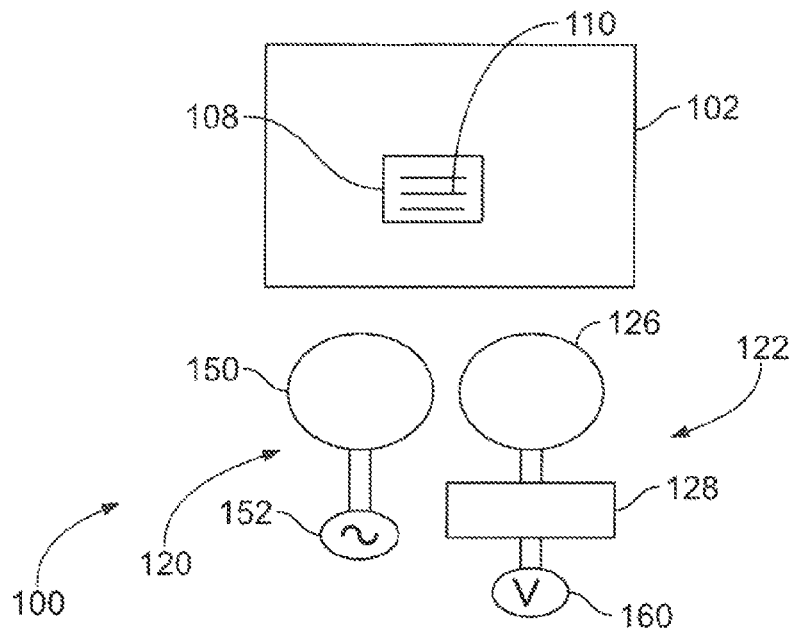
FIG. 8 illustrates a simplified schematic diagram of a system for detecting a foreign object, according to an embodiment of the present disclosure.

FIG. 8 illustrates a simplified schematic diagram of the system 100 for detecting the foreign object 102, according to an embodiment of the present disclosure. The system 100 may include the magnetic field generator 120, which may include a coil 150 that is configured to generate a low-frequency magnetic field. For example, the coil 150 may generate a magnetic field of 10 Oe. The coil 150 may be coupled to a current source 152. The generated magnetic field may be proportional to the current in the coil 150.

The magnetic field generated by the coil 150 propagates through space in which the label 108 is present. The label 108 may be secured to the foreign object 102 (that is, an object that is not designed to be part of a vehicle that is being manufactured, for example). The label 108 may include the magnetically-responsive member 110, such as ferromagnetic wires, which may be contained underneath or within a portion of the label 108. In at least one embodiment, the magnetically-responsive member 110 may have a low coercivity. For example, the magnetically-responsive member 110 may be formed of a mu-metal.

The magnetically-responsive member 110 generates a magnetic signal in response to the applied magnetic field generated by the coil 150. The magnetic signal from the magnetically-responsive member 110 propagates through space and impinges on the sensor 126 of the detector 122. For example, the sensor 126 may be or include a receiver coil. The changing magnetic flux in the sensor 126 generates a voltage, which may be input to the control unit 128 (such as detector electronics, as described above). The control unit 128 may process the signal and output the third harmonic of the signal to a voltmeter 160. When the voltage at the voltmeter 160 registers a value above background noise and/or a predetermined threshold, the presence of a magnetic material with low coercivity is present, thereby providing an indication of the presence of the foreign object 102.

By moving the magnetic field generator 120 or the detector 122, the direction of the foreign object 102 may be determined. As the third harmonic of the signal output by the magnetically-responsive member 110 gets stronger (for example, as either the magnetic field generator 120 or the detector 122 gets closer to the magnetically-responsive member 110), the direction of the foreign object 102 may be determined. For example, as the signal gets stronger, the detector 122 is being moved closer to the foreign object 102. If, however, the signal gets weaker, the detector 122 is being moved further away from the foreign object 102.

An individual may survey an area, enclosure, or the like in which the system 100 is to be used for magnetic field strength at different frequencies, and choose an excitation frequency of the current source 152 that has a low background signal. If the frequency to be used is known ahead of time, then the control unit 128 may include a bandpass filter, for example, to filter background noise. Alternatively, a connection between the current source 152 and the control unit 128 may be used, and the control unit 128 may be set to pass (for example, may be sensitive) the third harmonic of the reference frequency. For example, the control unit 128 and/or the voltmeter 160 may include an amplifier, such as a lock-in amplifier.

Figure 9:
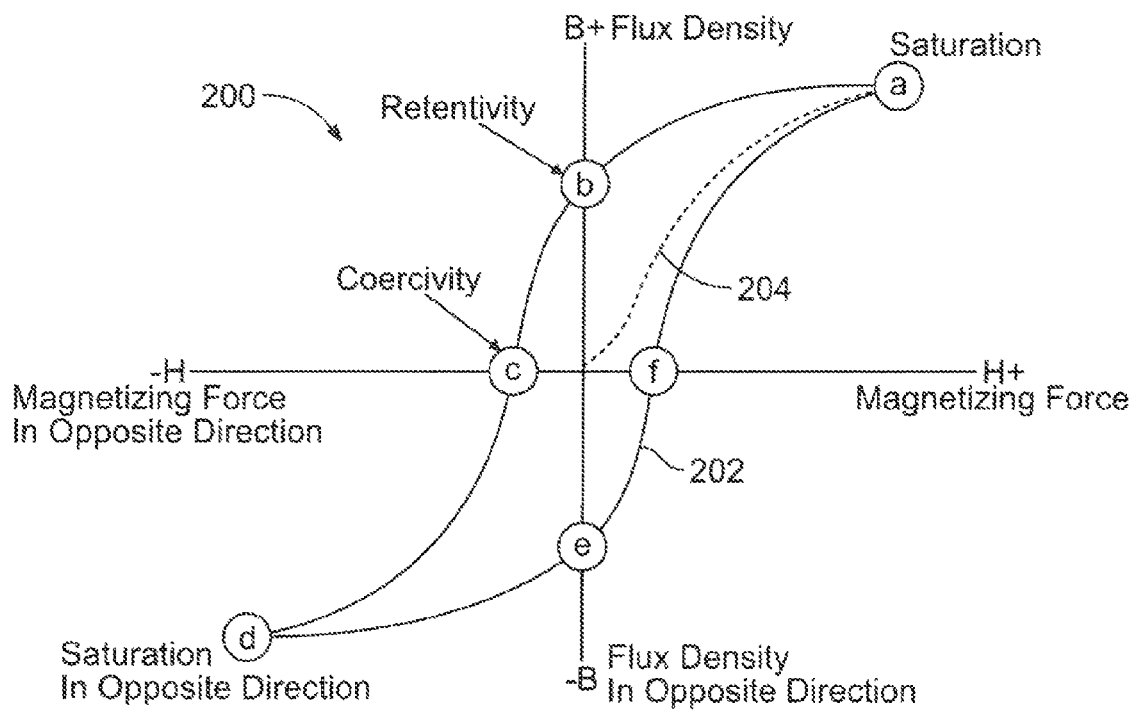
FIG. 9 illustrates a graph of a BH curve, according to an embodiment of the present disclosure.

A hysteresis loop of ferromagnetic materials has a coercivity that depends on the alloy composition and annealing conditions of the ferromagnetic materials. The ferromagnetic material chosen to be incorporated into the label 108 may have a low coercivity, such as that of mu-metal, by-mu80, permendur, or the like. A discussion of the behavior of magnetic response/magnetic field (BH) curves, and the presence or absence of a third harmonic in their magnetic signal under different applied fields is described below. In general, many magnetic materials (such as those used to form components of an aircraft) generally do not generate a third harmonic response at low applied magnetic fields (such as 10 Oe). Further, magnetic materials with high coercivities, such as ferromagnetic materials likely to be present in the background of an environment, generally do not produce a third harmonic signal at the same applied fields that cause third harmonic signals in the magnetically-responsive member 110, which may have a relatively low coercivity FIG. 9 illustrates a graph of a BH curve 200, according to an embodiment of the present disclosure. BH curves characterize a magnetic response (B) of a ferromagnetic material to an applied magnetic field (H). As the applied field H alternates at some frequency, the resulting response B is alternating and hysteretic. Ferromagnetic materials are typically highly nonlinear, and the shape of the BH curve varies significantly, depending on an amplitude of the applied field. In general, different materials have different BH curve shapes. When the applied magnetic field is large enough so that the magnetization of the ferromagnetic material becomes saturated, the BH curve 200 looks similar to that shown in FIG. 9.

A BH loop 202 is generated by measuring the magnetic flux of a ferromagnetic material while the magnetizing force is changed. A ferromagnetic material that has not been previously magnetized or has been thoroughly demagnetized follows the dashed line 204 as H increases. As the line demonstrates, the greater the amount of magnetizing force applied (H+), the stronger the magnetic field in the component (B+). At point "a" almost all of the magnetic domains are aligned and an additional increase in the magnetizing force produces little increase in magnetic flux. The material has reached the point of magnetic saturation. When H is reduced to zero, the curve moves from point "a" to point "b." At this point, it can be seen that some magnetic flux remains in the material even though the magnetizing force is zero. This is referred to as the point of retentivity on the graph and indicates the remanence or level of residual magnetism in the material. Some of the magnetic domains remain aligned but some have lost their alignment. As the magnetizing force is reversed, the curve moves to point "c", where the flux has been reduced to zero. This is called the point of coercivity on the curve. The reversed magnetizing force has changed enough of the domains so that the net flux within the material is zero. The force required to remove the residual magnetism from the material is called the coercive force or coercivity of the material.

As the magnetizing force is increased in the negative direction, the material again becomes magnetically saturated, but in an opposite direction (point "d"). Reducing H to zero brings the curve to point "e." It will have a level of residual magnetism equal to that achieved in the other direction. Increasing H back in the positive direction returns B to zero. Note that the curve returns to the origin of the graph because some force is required to remove the residual magnetism. The curve takes a different path from point "f" back to the saturation point where the loop 202 is completed.

From the hysteresis loop 202, a number of primary magnetic properties of a material may be determined: (1) Retentivity—A measure of the residual flux density corresponding to the saturation induction of a magnetic material. In other words, retentivity is a material's ability to retain a certain amount of residual magnetic field when the magnetizing force is removed after achieving saturation (that is, the value of B at point b on the hysteresis curve 202). (2) Residual Magnetism or Residual Flux—the magnetic flux density that remains in a material when the magnetizing force is zero. Note that residual magnetism and retentivity are the same when the material has been magnetized to the saturation point. However, the level of residual magnetism may be lower than the retentivity value when the magnetizing force does not reach the saturation level. (3) Coercive Force—The amount of reverse magnetic field that is applied to a magnetic material to make the magnetic flux return to zero (that is, the value of H at point c on the hysteresis curve 202).

If the applied magnetic field is greater than that at point a, the increase in B is very small with increasing H, and above point a, the magnetization is reversible. In general, BH curves such as those shown in FIG. 9, often have a portion of the curve, (for example, around point f) where the rise in B is very pronounced for a small change in H.

Figure 10:
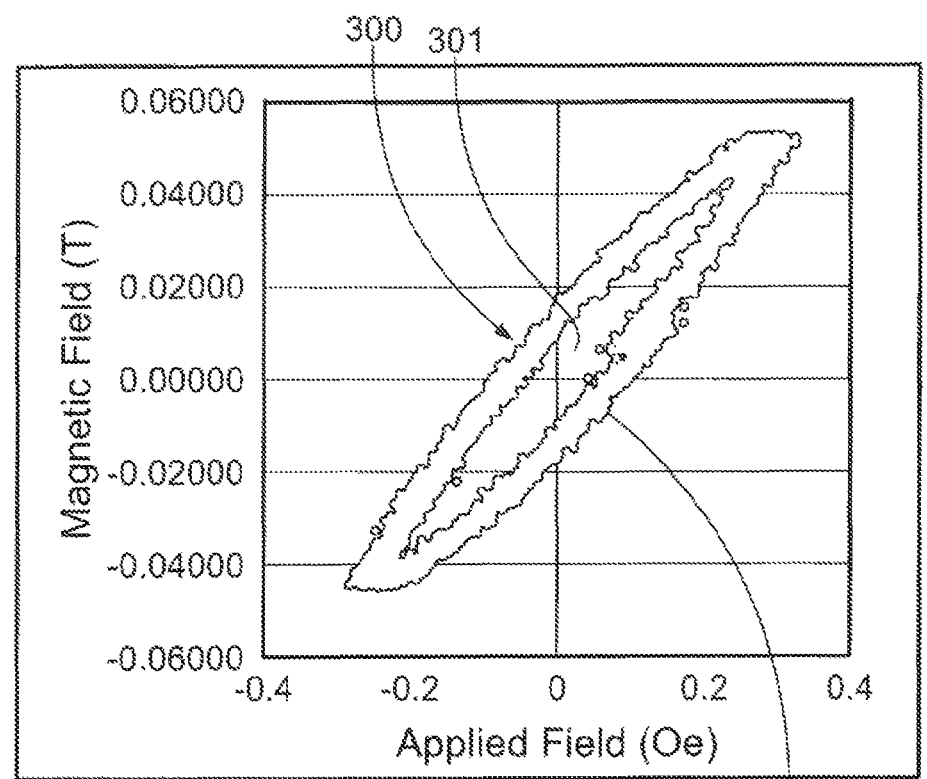
FIG. 10 illustrates a graph of a BH curve, according to an embodiment of the present disclosure.

FIG. 10 illustrates a graph of a BH curve 300, according to an embodiment of the present disclosure. At smaller applied fields (such as those that are substantially less than the coercive field), the BH curve 300 may look similar to that shown in FIG. 10. The material in this case is Hy-mu80 at a temperature of 70° F. The BH curve 300 takes the shape of an ellipse, and the area 301 inside the hysteresis loop 302 is relatively small. Even though the area of the BH curve 300 is relatively small, the material is still highly magnetic, with a relative permeability of approximately 450/0.36=1250.

Figure 11:
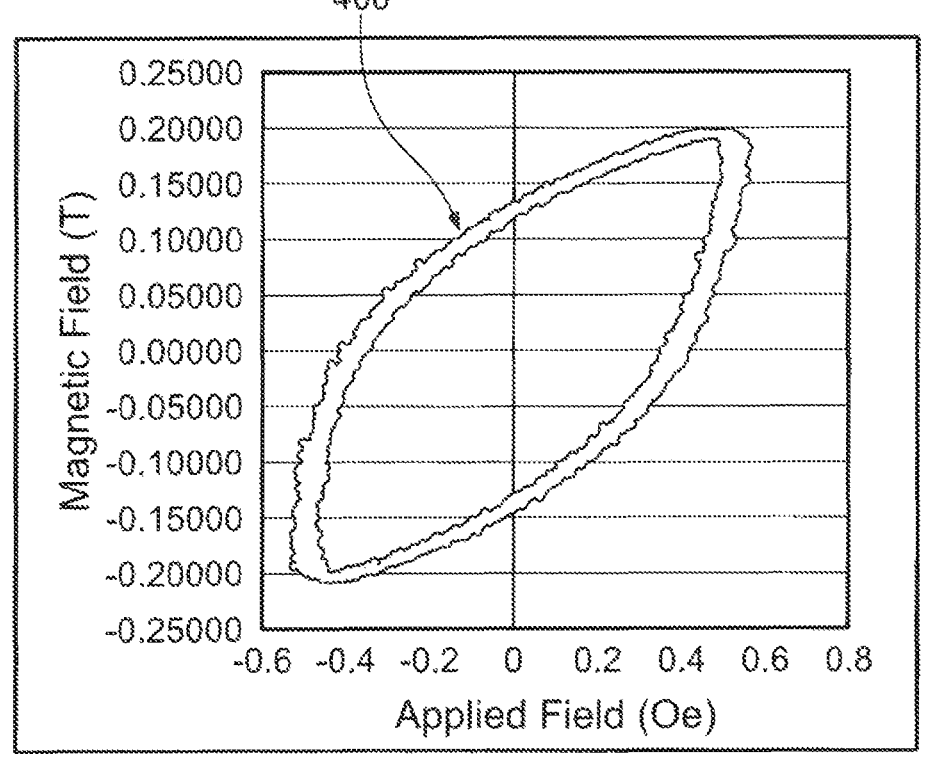
FIG. 11 illustrates a graph of a BH curve, according to an embodiment of the present disclosure.

FIG. 11 illustrates a graph of a BH curve 400, according to an embodiment of the present disclosure. As the applied field increases further from that shown in FIG. 10, and in particular at applied fields near the material's coercivity, the BH curve 400 starts to show a steep rise portion, as indicated in FIG. 11.

Figure 12:
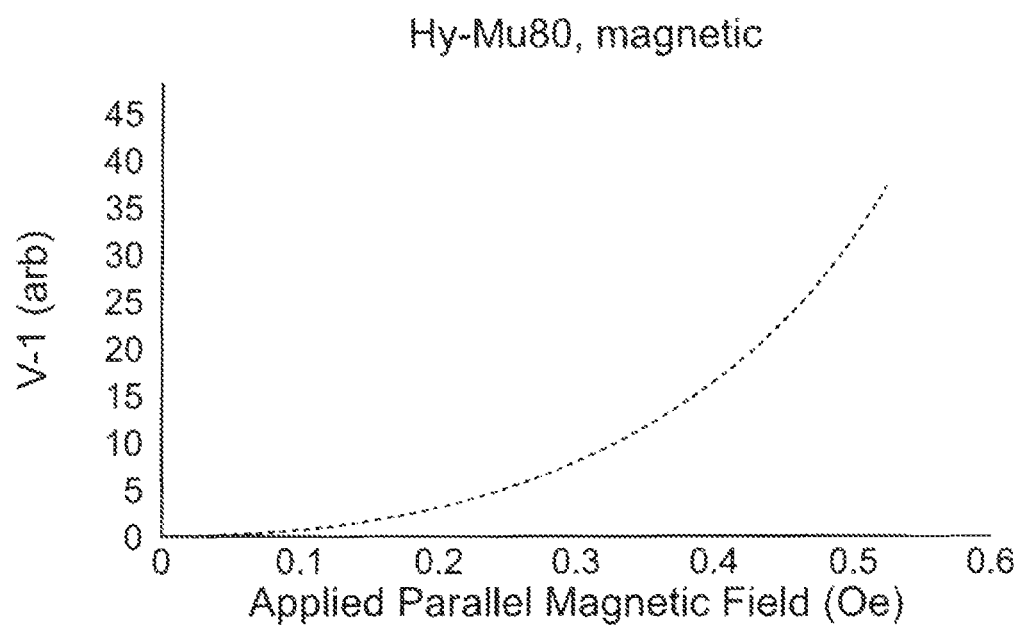
FIG. 12 illustrates a graph of magnetic response in relation to an applied magnetic field, according to an embodiment of the present disclosure.

FIG. 12 illustrates a graph of magnetic response in relation to applied magnetic field, according to an embodiment of the present disclosure. Changes in visual appearance of the BH curve correspond to changes in harmonic amplitudes of the magnetic response. The magnetic flux versus time may be decomposed into a Fourier series including the fundamental frequency (equal to the frequency of the applied field) and its harmonics (integer multiples of the fundamental). For example, the magnetic response at the fundamental frequency as a function of the applied field is shown in FIG. 12.

Figure 13:
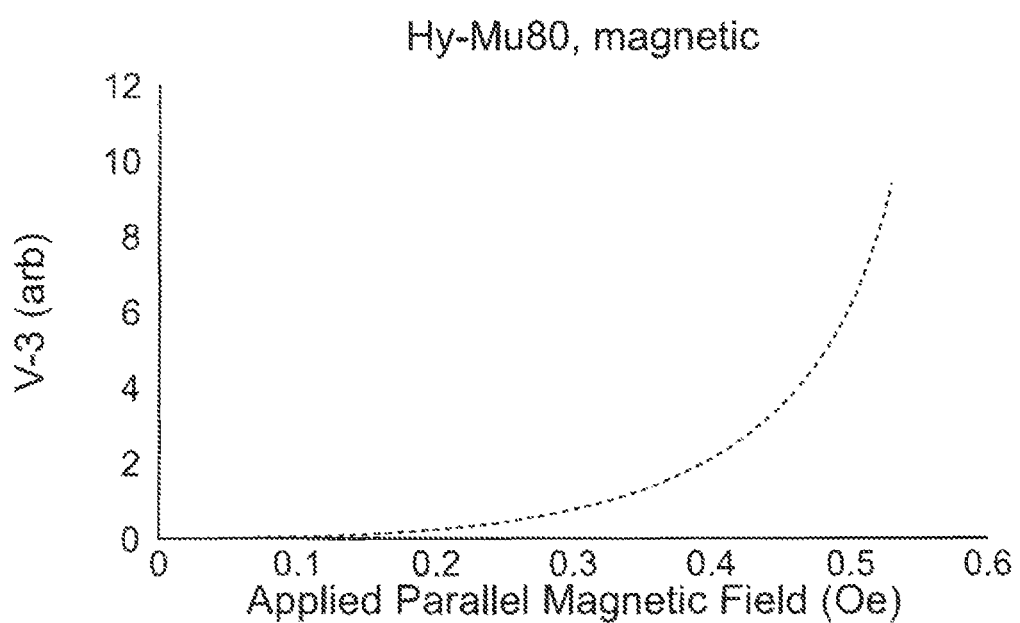
FIG. 13 illustrates a graph of magnetic response in relation to an applied magnetic field, according to an embodiment of the present disclosure.

FIG. 13 illustrates a graph of magnetic response in relation to applied magnetic field, according to an embodiment of the present disclosure. The fundamental frequency exhibits a smoothly varying function that tends to zero as the applied field tends to zero. The third harmonic of the magnetic response as a function of applied field is shown in FIG. 13. As shown in FIG. 13, the third harmonic is essentially zero until application of a threshold applied field, and then it increases rapidly.

Figure 14:
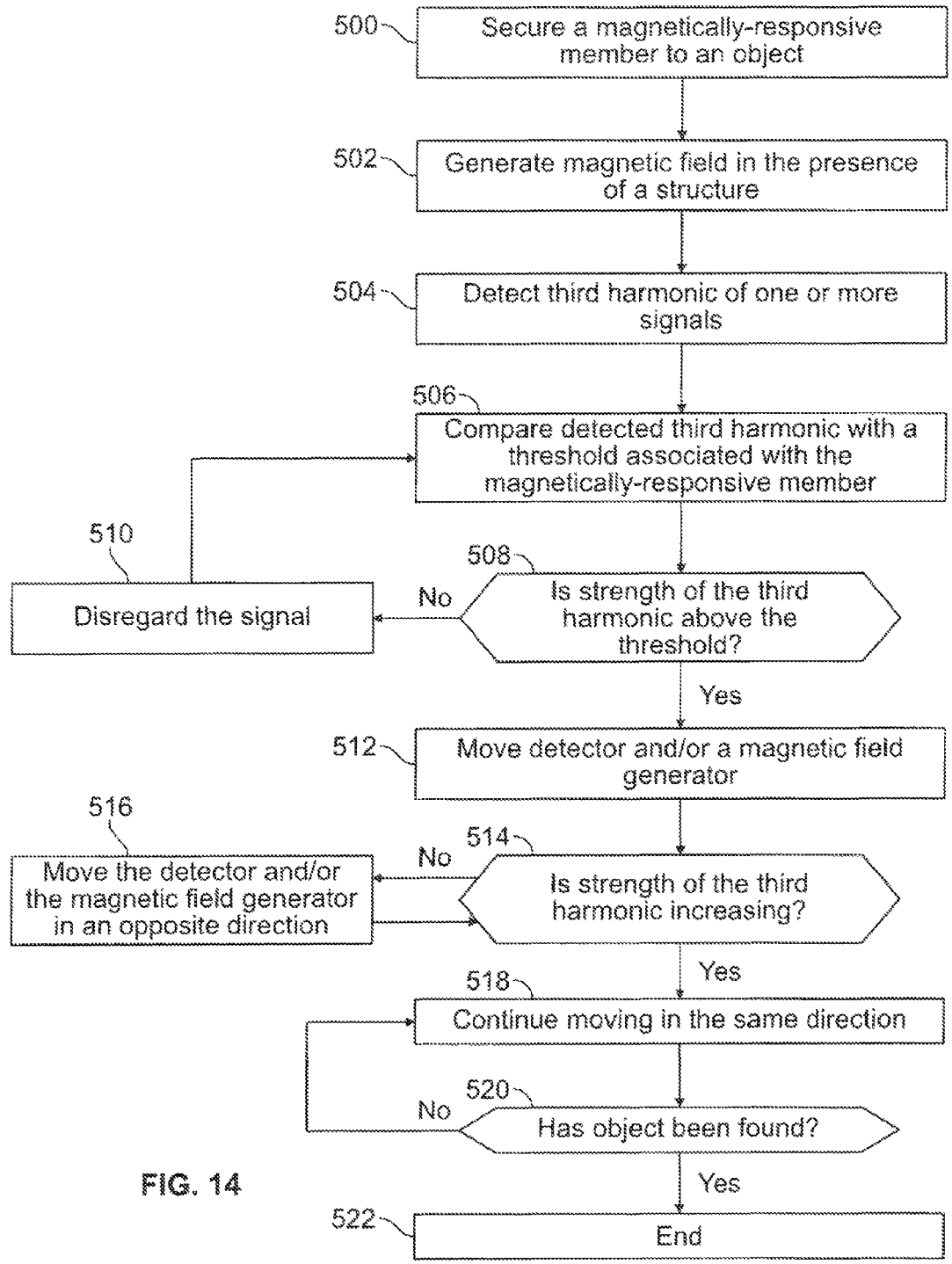
FIG. 14 illustrates a flow chart of a method of locating an object within a structure, according to an embodiment of the present disclosure.

FIG. 14 illustrates a flow chart of a method of locating an object within a structure, according to an embodiment of the present disclosure. The method begins at 500, in which a magnetically-responsive member is secured to an object. The magnetically-responsive member may be secured to a label that adheres or is otherwise secured to the object. In at least one other embodiment, the magnetically-responsive member may be directly secured to the object itself.

The control unit 128 (shown in FIG. 1) may operate according to various steps of the method shown in FIG. 14, beginning with 502. At 502, a magnetic field is generated in the presence of the structure. A magnetic field generator may be used to generate the magnetic field. The generated magnetic field may be a low applied magnetic field, such as between 5-15 Oe.

At 504, a third harmonic of one or more signals output in the presence of the generated magnetic field are detected. At 506, the detected third harmonic is compared with a threshold associated with the magnetically-responsive member. The threshold may be a predetermined third harmonic strength that is associated with a signal output by the magnetically-responsive member in the presence of a magnetic field. The threshold may be substantially higher (for example, 10, 20, 30, 100, or more times) than third harmonic strengths of other materials.

At 508, it is determined whether the strength of the third harmonic is above the threshold. If not, the method proceeds to 510, in which the signal is disregarded, and the method returns to 506.

If, however, the strength of the third harmonic is at or above the threshold, then the method proceeds from 508 to 512, in which one or both of a detector and/or a magnetic field generator are moved. At 514, it is determined whether, upon movement of the detector and/or the magnetic field generator, the strength of the third harmonic is increasing. If the strength of the third harmonic is not increasing, the method proceeds from 514 to 516, in which one or both of the detector and/or the magnetic field generator are moved in a different (for example, opposite) direction from the direction of initial movement, and the method then returns to 514.

If, upon movement, the strength of the third harmonic is increasing, the method proceeds from 514 to 518, in which the detector and/or the magnetic field generator continue to be moved in the same direction. The method then proceeds to 520, in which it is determined if the object has been found. If not, the method returns to 518. If, however, the object has been found, the method ends at 522.

As described above, embodiments of the present disclosure provide systems and methods that may be used to locate tools, and other similar objects, accidentally left on a vehicle (such as an aircraft) which may ultimately result in a foreign object debris condition. The system may include a label having a magnetically-responsive member (such as a coil of wire) attached thereto. A detector may then be used to detect the tool by specifically isolating a signal emitted by the magnetically-response member when in close proximity to the detector. The magnetically-response member may be formed of a mu-metal.

In operation, when the magnetically-response member is energized with a low-frequency alternating current emitted by the detector, a magnetic field is generated that is capable of penetrating electrically conducting sheets. The detector (such as the coil thereof) is sensitive to the third harmonic of the excitation frequency. The magnetically-response member responds to the excitation field with a magnetic signal at the excitation frequency and the third harmonic of this frequency. Other ferromagnetic material in the background may respond at the excitation frequency but not at the third harmonic.

Accordingly, embodiments of the present disclosure provide a system and a method of efficiently detecting objects, such as foreign object debris, such as within or on a vehicle.

Figure 15:
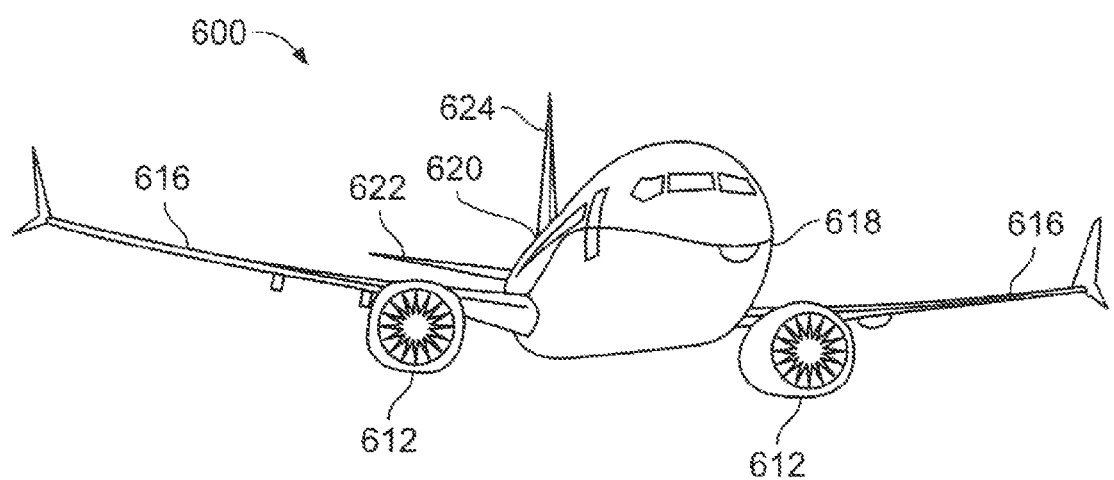
FIG. 15 illustrates a perspective front view of an aircraft.

FIG. 15 illustrates a perspective front view of an aircraft 600. Embodiments of the present disclosure may be used to detect foreign objects within the aircraft 600. For example, as the aircraft 600 is being assembled, the systems and methods described above may be used to detect various foreign objects (such as tools) left within portions of the aircraft 600.

The aircraft 600 may include a propulsion system that may include two turbofan engines 612, for example. Optionally, the propulsion system may include more engines 612 than shown. The engines 612 are carried by wings 616 of the aircraft 600. In other embodiments, the engines 612 may be carried by a fuselage 618 and/or an empennage 620. The empennage 620 may also support horizontal stabilizers 622 and a vertical stabilizer 624. The wings 616, the horizontal stabilizers 622, and the vertical stabilizer 624 may each include one or more control surfaces.

Optionally, embodiments of the present disclosure may be used to detect foreign objects within various other structures, such as other vehicles (including automobiles, watercraft, spacecraft, and the like), buildings, appliances, and the like.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A system for locating an object within a structure, the system comprising:
   a magnetic field generator configured to generate a magnetic field in the presence of the structure, wherein the magnetic field causes a magnetically-responsive member coupled to the object to output a signal when the magnetically-responsive member is in the presence of the magnetic field; and
   a detector comprising a sensor coupled to a control unit, wherein the sensor is configured to detect the signal output by the magnetically-responsive member, and wherein the control unit is configured to locate the object based on detection of a third harmonic of the signal.

2. The system of claim 1, further comprising a label affixed to the object, wherein the label identifies the object, and wherein the magnetically-responsive member is secured to the label.

3. The system of claim 1, wherein the magnetically-responsive member is directly secured to the object.

4. The system of claim 1, wherein the magnetic field generator is remote from the detector.

5. The system of claim 1, wherein the magnetic field generator and the detector are contained in a common housing.

6. The system of claim 1, wherein the magnetically-responsive member is formed of a mu-metal.

7. The system of claim 1, wherein the magnetically-responsive member comprises a ferromagnetic coil.

8. The system of claim 1, wherein the magnetically-responsive member is formed of a ferromagnetic material that is not found in the structure.

9. The system of claim 1, wherein the magnetic field has a magnitude of 10 Oersteds.

10. The system of claim 1, wherein the control unit is configured to compare the third harmonic to a threshold value associated with the magnetically-responsive member to determine the presence of the magnetically-responsive member, and wherein the control unit is configured to disregard other signals that are below the threshold value.

11. The system of claim 1, wherein the control unit is configured to determine a distance of the magnetically-responsive member to one or both of the detector or the magnetic field generator based on a strength of the third harmonic.

12. A method of locating an object within a structure, the method comprising:
coupling a magnetically-responsive member to the object;
generating a magnetic field in the presence of the structure;
causing the magnetically-responsive member to output a signal when the magnetically-responsive member is in the presence of the magnetic field;
detecting the signal output by the magnetically-responsive member; and
locating the object based on a third harmonic of the signal that is detected.

13. The method of claim 12, wherein the coupling comprises:
securing the magnetically-responsive member to a label that identifies the object; and
affixing the label to the object.

14. The method of claim 12, wherein the coupling comprises directly securing the magnetically-responsive member to the object.

15. The method of claim 12, further comprising forming the magnetically-responsive member from a mu-metal.

16. The method of claim 12, further comprising forming the magnetically-responsive member from a ferromagnetic material that is not found in the structure.

17. The method of claim 12, wherein the generating comprises generating a magnetic field of 10 Oersteds.

18. The method of claim 12, wherein the locating comprises:
comparing the third harmonic to a threshold value associated with the magnetically-responsive member to determine the presence of the magnetically-responsive member; and
disregarding other signals that are below the threshold value.

19. The method of claim 12, wherein the locating comprises determining a distance of the magnetically-responsive member to one or both of the detector or the magnetic field generator based on a strength of the third harmonic.

20. A system for locating an object within a structure, the system comprising:
a label affixed to the object, wherein the label identifies the object;
a magnetically-responsive member secured to the label, wherein the magnetically-responsive member includes a coil of mu-metal secured to the label;
a magnetic field generator configured to generate a magnetic field in the presence of the structure, wherein the magnetic field causes the magnetically-responsive member to output a signal when the magnetically-responsive member is in the presence of the magnetic field; and
a detector comprising a sensor coupled to a control unit, wherein the sensor is configured to detect the signal output by the magnetically-responsive member, wherein the control unit is configured to locate the object based on detection of a third harmonic of the signal, wherein the control unit is configured to compare the third harmonic to a threshold value associated with the magnetically-responsive member to determine the presence of the magnetically-responsive member, wherein the control unit is configured to disregard other signals that are below the threshold value, and wherein the control unit is configured to determine a distance of the magnetically-responsive member to one or both of the detector or the magnetic field generator based on a strength of the third harmonic.

\* \* \* \* \*

UNITED STATES PATENT AND TRADEMARK OFFICE
CERTIFICATE OF CORRECTION

PATENT NO. : 9,772,422 B2
APPLICATION NO. : 14/955223
DATED : September 26, 2017
INVENTOR(S) : John R. Hull et al.

It is certified that error appears in the above-identified patent and that said Letters Patent is hereby corrected as shown below:

On the Title Page

In item (72) Inventors: Inventor Daniel L. Byrum's last name is: Bynum

Signed and Sealed this
Seventh Day of November, 2017

Joseph Matal
*Performing the Functions and Duties of the*
*Under Secretary of Commerce for Intellectual Property and*
*Director of the United States Patent and Trademark Office*